United States Patent [19]
Hong

[11] Patent Number: 5,460,991
[45] Date of Patent: Oct. 24, 1995

[54] METHOD OF MAKING HIGH COUPLING RATIO FLASH EEPROM DEVICE

[75] Inventor: Gary Hong, Hsin, Taiwan

[73] Assignee: United Microelectronics Corporation, Hsinchu, Taiwan

[21] Appl. No.: 405,229

[22] Filed: Mar. 16, 1995

[51] Int. Cl.$^6$ ............................................. H01L 21/8247
[52] U.S. Cl. ................................................ 437/43; 437/46
[58] Field of Search ................................. 437/43, 48, 52, 437/46

[56] References Cited

U.S. PATENT DOCUMENTS

| | | | |
|---|---|---|---|
| 4,209,349 | 6/1980 | Ho et al. | 148/187 |
| 4,648,937 | 3/1987 | Ogura et al. | 156/643 |
| 5,236,853 | 8/1993 | Hsue | 437/43 |
| 5,371,027 | 12/1994 | Walker et al. | 437/43 |

OTHER PUBLICATIONS

Hisamune et al. in IEDM 93-19-22, "A High Capacitive-Coupling Ratio, (HiCR), Cell for 3v Only 64 Mbit and Future Flash Memories", 1993.

*Primary Examiner*—Olik Chaudhuri
*Assistant Examiner*—Richard A. Booth
*Attorney, Agent, or Firm*—George O. Saile

[57] ABSTRACT

A method of fabricating an erasable electrical programmable read only memory, (EEPROM), device has been developed. This device results in a high capacitive coupling ratio cell due to the ability of the described process to maintain the tunneling region at minimum dimensions. This in turn is accomplished by the novel sidewall image transfer, and removal processes described in this invention.

20 Claims, 4 Drawing Sheets

| | $V_{CG}$ | $V_D$ | $V_S$ |
|---|---|---|---|
| Program | 10V | 0 | Floating |
| Erase | 0 | Floating | 8v |
| Read | 5v | 1v | 0 |

METHOD OF MAKING HIGH COUPLING RATIO FLASH EEPROM DEVICE

BACKGROUND OF THE INVENTION (1) Field of the Invention

The present invention relates to a semiconductor fabrication process employed to create an erasable electrical programmable read only memory, (EEPROM), device.

(2) Description of Prior Art

The trend to fast, low power, nonvolatile memory devices has benefitted by both advances in specific semiconductor sector disciplines, as well as advances in chip fabrication schemes. The ability to obtain higher performing erasable electrical programmable read only memory, (EEPROM), devices, is largely influenced by the capacitive-coupling ratio of the cell. The desired high capacitive-coupling ratio, (HiCR), cell, can be obtained by reducing the area of tunnel insulator. The tunnel insulator allows the cell to be programmed and erased via Fowler-Nordheim tunneling.

Many advances in semiconductor disciplines have allowed smaller chip dimensions to be realized. For example photolithographic improvements, in terms of more advanced cameras as well as more sensitive photoresist materials, have allowed sub-micrometer images to be realized. Similar progress in reactive ion etching, (RIE), has also led to success of the transferred sub-micrometer image, from the photoresist mask to various underlying materials. In addition rapid development of low pressure chemical vapor deposition, (LPCVD), and ion implantation disciplines have also contributed to the ability of the semiconductor industry to manufacture smaller, faster devices. However these advances, in specific semiconductor fabrication disciplines have only slightly aided in reducing the tunnel insulator area of EEPROM devices.

A processing scheme, described by Ogura, et al, in U.S. Pat. No. 4,648,937, illustrates a method of sidewall image transfer, which allows sub-micrometer images to be achieved. In U.S. Pat. No. 5,236,853, Hsue, applies a similar sidewall image transfer process, to the fabrication of specific ROM devices. In addition Hisamune, et al, in IEDM, 93-19-22, "A High Capacitive-Coupling Ratio, (HiCR), Cell for 3 V Only 64 Mbit and Future Flash Memories", describe process methods for EEPROM fabrication. However this present invention will describe a EEPROM fabrication process, less complex then the process used by Hisamune, et al, and resulting in EEPROM devices that offer high performance.

SUMMARY OF THE INVENTION

It is an object of this invention to fabricate EEPROM devices with a high capacitive-coupling ratio for the cell.

It is another object of this invention to fabricate EEPROM devices using small, self-aligned tunneling regions.

It is yet another object of this invention to fabricate EEPROM devices using sidewall transfer technology to create the tunneling region.

In accordance with the present invention, a method for forming high performance EEPROM devices is achieved. The method involves growing a gate oxide, followed by a silicon nitride deposition. Patterning of the silicon nitride, and using the silicon nitride shape for the self aligned, N+0 ion implantation step, create the source and drain regions. Next a thin layer of chemically vapor deposited silicon oxide is grown, followed by a photoresist application and etchback of the photoresist, to expose the surface of the silicon oxide, on the top of the silicon nitride shape. The silicon oxide is next removed from the top and sides of the silicon nitride shape, via wet etch processing. The removal of the silicon oxide from the sides of the silicon nitride shape exposes the gate oxide, which is also removed. A tunnel oxide growth is then performed, in the region where the gate oxide had been removed, followed by polysilicon deposition, doping and patterning processes, used to create the floating gate structure. An inter-polysilicon dielectric is then deposited followed by a second polysilicon deposition, doping and patterning, performed to create the control gate structure. Insulator deposition, patterning to, open vias to the appropriate elements, metallization, and patterning the metallization to form contacts to specific cell elements complete the process.

BRIEF DESCRIPTION OF THE DRAWINGS

The object and other advantages of this invention are best explained in the preferred embodiment with reference to the attached drawing that include.

DESCRIPTION OF THE PREFERRED EMBODIMENTS

The method for fabricating EEPROM devices, exhibiting high capacitive-coupling ratios, will now be described in detail.

Figure 1:
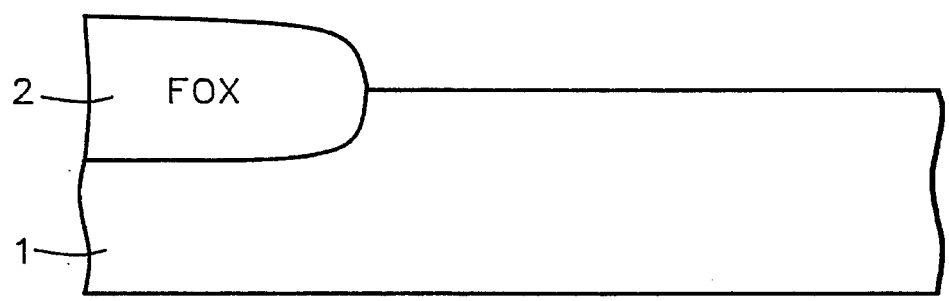
FIGS. 1 through 9, which schematically illustrate, in cross-sectional representation, the stages of fabrication for the EEPROM.

A silicon substrate, P type, having a <100> crystallographic orientation is shown as structure 1, in FIG. 1. A thick field oxide, (FOX) 2, is grown, for purposes of isolation. Briefly, the method used to produce the FOX region is to use an oxidation mask consisting of a thin silicon dioxide layer, and an overlying silicon nitride layer. The silicon dioxide film, serving as the pad oxide, is obtained via conventional thermal oxidation, while the silicon nitride layer, serving as the oxidation mask, is obtained using low pressure chemical vapor deposition, (LPCVD), processing. After photolithography procedures, to arrive at the desired isolation shape in the photoresist, the shape is transferred to the underlying silicon nitride-silicon dioxide layers via reactive ion etching, (RIE). After photoresist removal, followed by careful wet cleans, the FOX growth occurs, using steam at a temperature between about 850° to 1050° C., to a thickness between about 4000 to 6000 Angstroms. Next the masking layers are removed, via a hot phosphoric acid treatment for the silicon nitride, and a buffered hydrofluoric acid treatment for the silicon dioxide layer. The resulting FOX region, 2, is shown in FIG. 1

Figure 2:
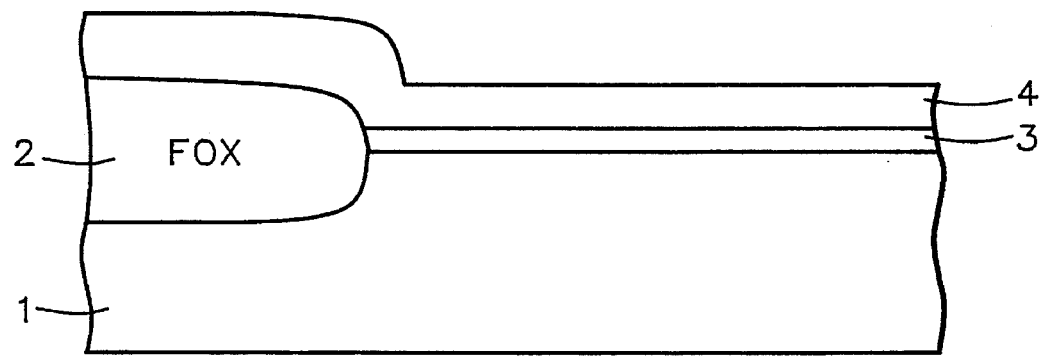

After a careful wet cleaning, to insure against both organic and inorganic contaminents, a silicon dioxide gate, 3, is grown at a temperature between about 800° to 1000° C., to a thickness between about 150 to 300 Angstroms, and shown in FIG. 2. A silicon nitride film, 4, also shown in FIG. 2, is next deposited, using LPCVD techniques, to a thickness between about 1000 to 4000 Angstroms.

Figure 3:
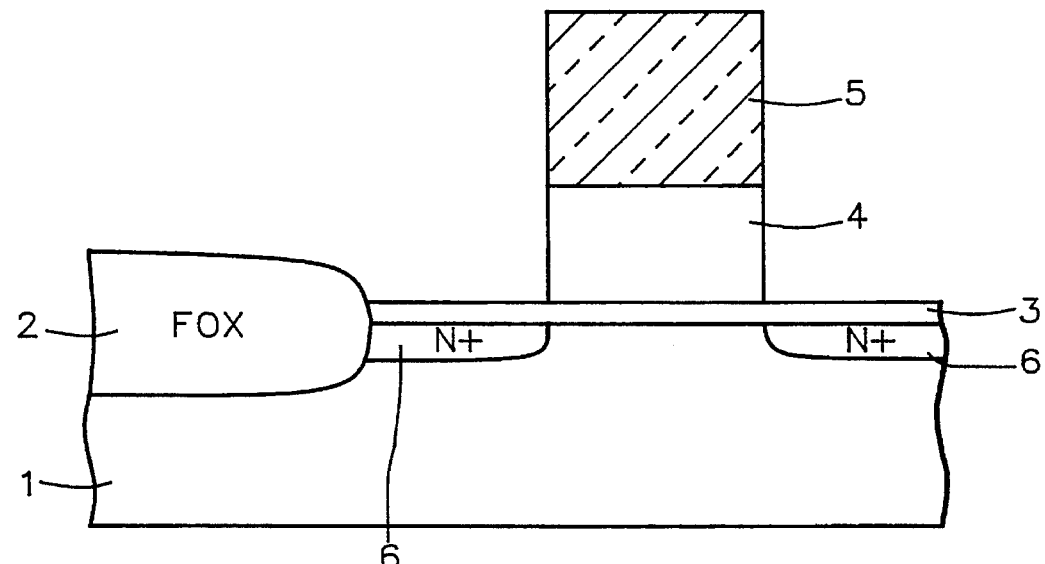

FIG. 3 shows the result of patterning the silicon nitride layer. Conventional photolithography processing is used to define a desired shape, 5, to be transferred to the underlying silicon nitride layer, 4, via RIE processing. This RIE chemistry was chosen so that selectivity would exist between the silicon nitride and the underlying silicon dioxide, 3. It is important that the RIE procedure stop in the gate oxide, and not penetrate to the underlying silicon substrate. The photoresist shape, 5, and the silicon nitride 4, now allow for a self-aligned source and drain region, 6, to be fabricated. This is accomplished via ion implantation of arsenic, at an energy of between about 50 to 100 Kev., at a dose between about 1E14 to 1E16 atoms/cm$^2$. If phosphorous is used for the source and drain regions, an energy of 30 to 60 Kev., again at a dose between about 1E14 to 1E16 would be used.

Figure 4:
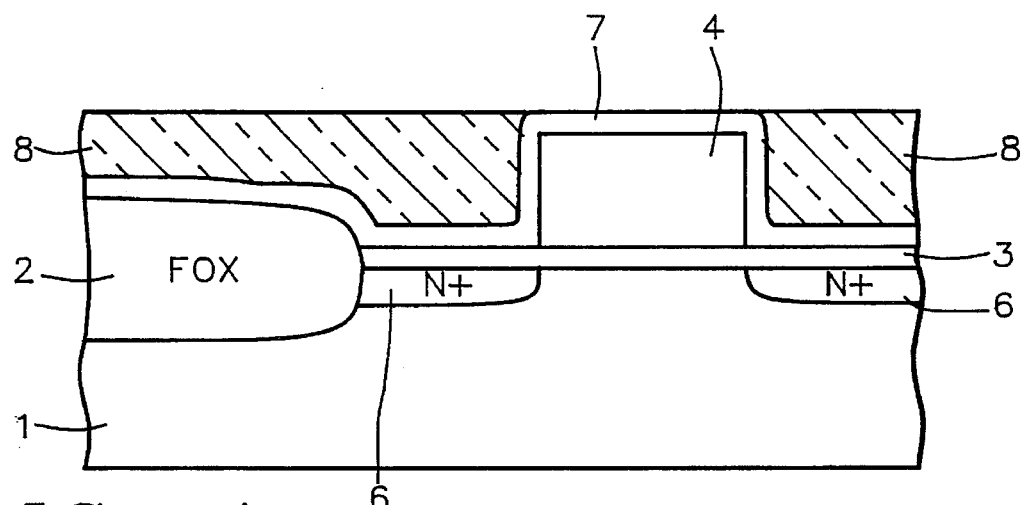
Figure 5:
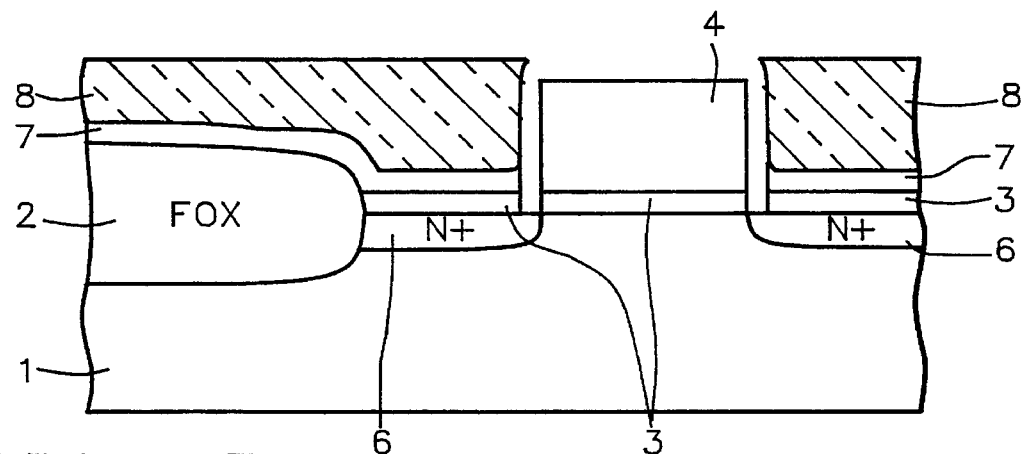

After photoresist removal, again followed by careful wet cleans to protect against contaminents, a LPCVD silicon oxide layer, 7, is deposited to a thickness between about 500 to 3000 Angstroms. An application of photoresist, 8, and an etchback, using an oxygen plasma, create the structure shown in FIG. 4. The etchback in the oxygen plasma is performed to the point where the top surface of silicon oxide, 7, is exposed. A wet etch, using, buffered HF, is next performed, using photoresist, 8, as a mask, to remove the exposed silicon oxide, 7, from the top and sides of silicon nitride shape, 4. In addition, the gate silicon dioxide, 3, now exposed, due to the removal of sidewall silicon oxide, 7, is also removed in the buffered hydrofluoric acid procedure. These wet procedures result the structure shown in FIG. 5.

Figure 6:
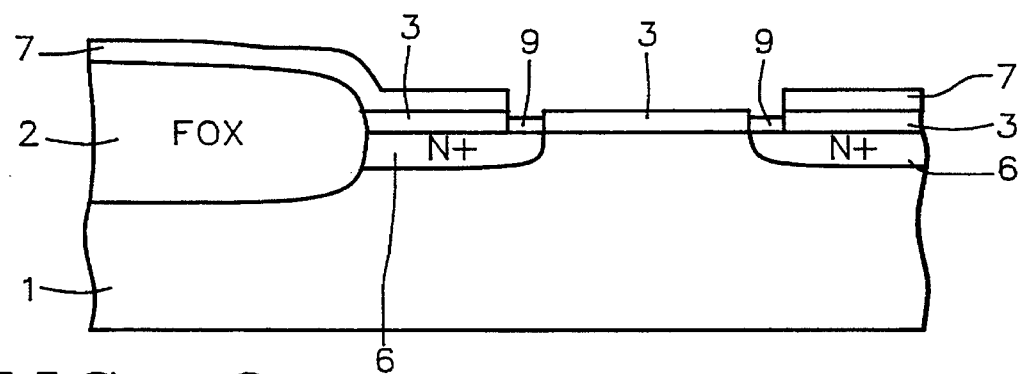

Photo resist removal and careful wet cleans are are next performed, followed by removal of the silicon nitride shape, 4, via a hot phosphoric acid procedure. A critical oxidation is now performed for purposes of creating the tunnel insulator, 9, show in FIG. 6. This is accomplished by thermal oxidation at a temperature between about 800° to 1000° C., in an oxygen, or oxygen-nitrogen ambient, to obtain an insulator thickness between about 50 to 100 Angstroms. It should be noted that the area of the critical tunnel insulator is small, created by the removal of silicon oxide, 7, from the sides of silicon nitride shape, 4. Therefore the ability to obtain the high capacitive-coupling ratio cell is a strong function of controlling the thickness of silicon oxide layer, 7, and the tunnel dielectric, 9.

Figure 7:
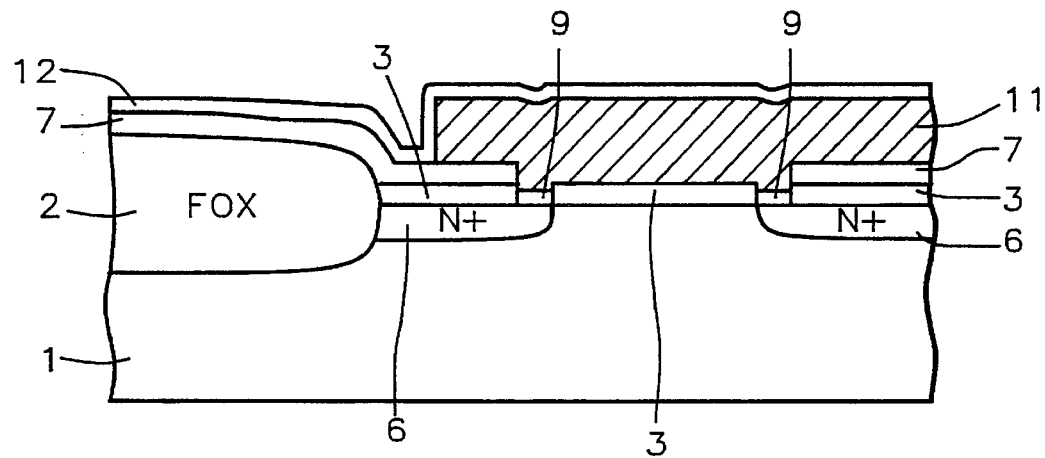

The floating gate structure is now fabricated, first by depositing a polysilicon layer, via conventional LPCVD techniques, to a thickness between about 500 to 2000 Angstroms. The polysilicon film is then subjected to an ion implantation of arsenic or phosphorous, at an energy between about 30 to 80 Kev., at a dose between about 1E14 to 1E16 atoms/cm2. Polysilicon doping can also be accomplished by POCL3 processing, at a temperature between about 800° to 950° C., for a time between about 10 to 20 min. Standard photolithographic processing followed by RIE produce the floating gate polysilicon structure, 11, shown in FIG. 7. After photoresist removal, a inter-polysilicon dielectric layer, 12, is formed. Layer 12, called ONO, (oxide-nitride-oxide) shown in FIG. 7, is composed of an underlying thin thermal oxide, with a thin silicon nitride, plus an overlying layer of thermal oxynitride. This is fabricated by initially growing a thermal oxide in steam at a temperature between about 800° to 1000° C. to a thickness between about 50 to 100 Angstroms. Next a low pressure chemical vapor deposition, (LPCVD), of silicon nitride is performed to a thickness between about 100 to 200 angstroms. Next a thermal oxidation is performed, at a temperature between about 900° to 1050° C., for a time between about 20 to 40 min., in a wet oxygen ambient, for purposes of converting the surface of the silicon nitride to a thin layer of oxynitride.

Figure 8:
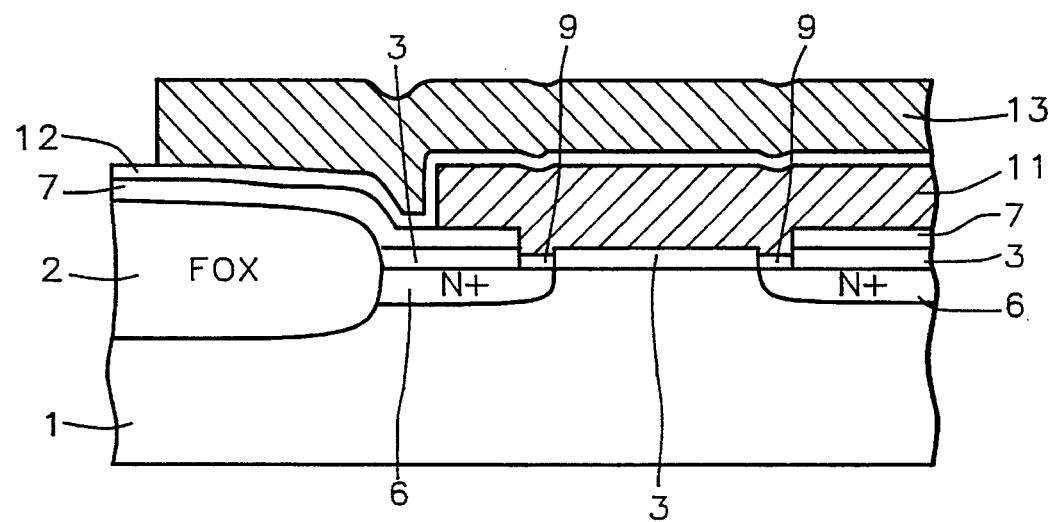

The control gate is next fabricated, again by initially depositing a polysilicon layer using LPCVD processing to a thickness between about 1000 to 5000 Angstroms. An ion implantation is performed, using arsenic or phosphorous, at an energy between about 30 to 80 Kev., at a dose between about 1E14 to 1E16 atoms/cm2. Again as was the case for the floating gate, POCL3 doping can be used to dope the control gate, at a temperature between about 850° to 950° C., for a time between about 10 to 30 min. It should also be noted that the control gate can be a polycide, such as WSi2 over polysilicon. Conventional photolithographic and RIE processing is employed to create the polysilicon control gate structure, 13, shown in FIG. 8. It is important that the RIE reactants chosen are selective, so at the conclusion of the polysilicon etching the underlying dielectric layers, 10, and the source and drain regions, 6, are not consumed. Therefore the selective etchant used for this procedure is a Cl2 based plasma etching process.

Figures 9, 10:
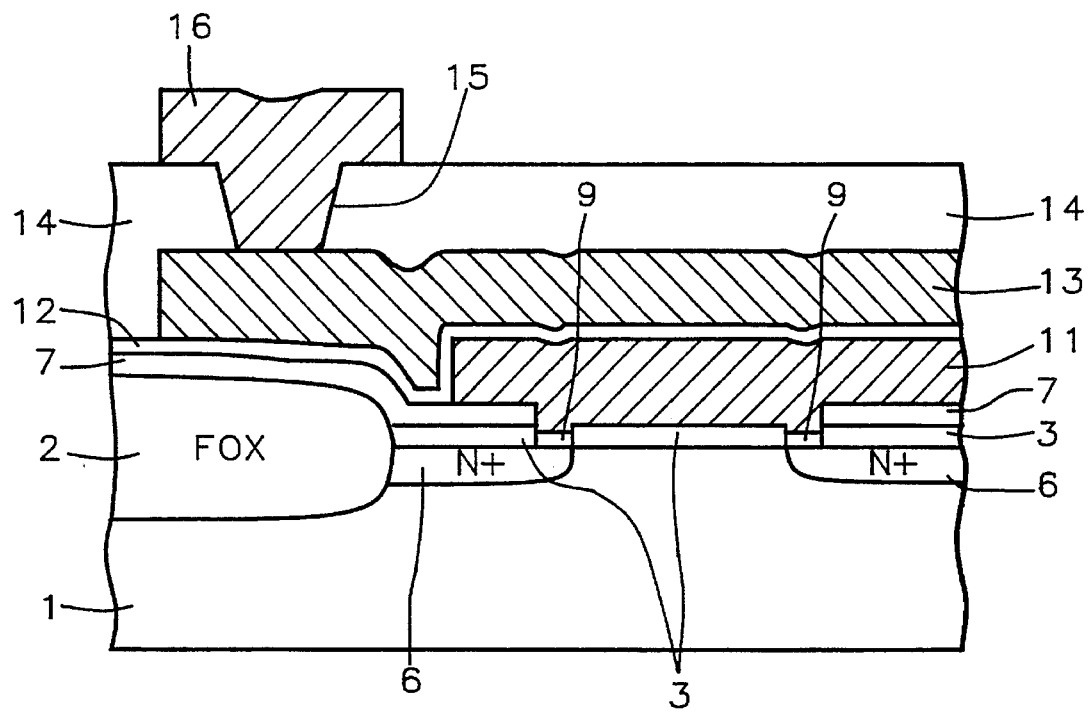
FIG. 10, which supplies an example of the cell operation conditions obtainable with this EEPROM structure.

To complete the EEPROM fabrication process a silicon oxide film, 14, is deposited to a thickness between about 4000 to 6000 Angstroms. Standard photolithographic and RIE processing are used to open via holes, 15, to the polysilicon control gate, 13, and to the source and drain regions, 6, (not shown). A deposition of Al—Cu—Si to a to a thickness between about 5,000 to 20,000 Angstroms, followed by patterning of this metallization result in metal contacts 16, shown in FIG. 9. An example of the cell operation conditions are shown in FIG. 10, where Vcg is the voltage supplied to the control gate, and Vs and Vd are the voltages supplied to the source and drain regions.

It should be noted that this invention, "A High Coupling Ratio Flash Memory EEPROM Device", although shown as an N channel structure can also be created as a P channel device.

While this invention has been particularly shown and described with reference to the preferred embodiments thereof, it will be understood by those skilled in the art that various changes in form and details may be made without departing from the spirit and scope of this invention.

What is claimed is:

1. A method of fabricating an erasable electrical programmable read only memory, (EEPROM), cell on a semiconductor substrate comprising the steps of:

forming a field oxide pattern on regions of said substrate, while leaving unoxidized silicon on remaining regions of said substrate;

thermally growing a gate oxide on said substrate;

depositing a silicon nitride layer on said gate oxide and on said field oxide region;

patterning to form an island of said silicon nitride on said gate oxide;

ion implanting a first dopant into portions of said substrate, not masked by said silicon nitride island or by said field oxide region;

depositing a first silicon oxide layer on said field oxide region, on an upper surface of said silicon nitride island, on sidewalls of said silicon nitride island, and on regions of said substrate, covered with said gate oxide but not masked by said silicon nitride island;

application of photo resist on said first silicon oxide layer;

etchback of said photoresist to expose said first silicon oxide layer on said upper surface of said silicon nitride island;

removal of said first silicon oxide layer from said exposed upper surface of said silicon nitride island, and from sidewalls of said silicon nitride island;

removal of said gate oxide from regions between said silicon nitride island and said photoresist;

removal of said photoresist;

removal of said silicon nitride island;

growing a first dielectric layer on said region where said gate oxide had been removed;

depositing a first polysilicon layer on said field oxide region, on said gate oxide, and on said first dielectric layer on region where said gate oxide had been previously removed;

ion implanting a second into said first polysilicon layer;

patterning to form said first polysilicon structure, on said gate oxide, and on said first dielectric layer on region where said gate oxide had been previously removed;

forming a second dielectric layer on said first polysilicon structure;

depositing a second polysilicon layer over said field oxide region and on said second dielectric layer overlying said first polysilicon structure;

ion implanting a third dopant into said second polysilicon layer; and patterning to form said second polysilicon structure, on said second dielectric layer overlying said first polysilicon structure and over said field oxide region.

2. The method of claim 1, wherein said gate oxide is grown at a temperature between about 800° to 1000° C., to a thickness of between about 150 to 300 Angstroms.

3. The method of claim 1, wherein said first dopant is arsenic, ion implanted at an energy between about 50 to 100 Kev., at a dose between about 1E14 to 1E16 atoms/cm2.

4. The method of claim 1, wherein said first silicon oxide layer is grown using LPCVD to a thickness between about 500 to 3000 Angstroms.

5. The method of claim 1, wherein said first dielectric layer is thermally grown silicon dioxide, grown in an oxygen ambient at a temperature between about 800° to 1000° C., to a thickness between about 50 to 100 Angstroms.

6. The method of claim 1, wherein said first polysilicon layer is deposited, using LPCVD, to a thickness between about 500 to 8000 Angstroms.

7. The method of claim 1, wherein said second dopant is arsenic, ion implanted at an energy between about 30 to 80 Kev., at a dose between about 1E14 to 1E16 atoms/cm2.

8. The method of claim 1, wherein said second dielectric layer is a composite of: an underlay of thermal oxide, grown in steam at a temperature between about 800° to 1000° C., to a thickness between about 50 to 100 angstroms; an LPCVD silicon nitride layer, deposited to a thickness between about 100 to 200 Angstroms; and a silicon oxynitride surface layer, formed by subjecting silicon nitride to a wet oxygen treatment at a temperature between about 900° to 1050° C. for a time between about 20 to 40 minutes.

9. The method of claim 1, wherein said second polysilicon layer is deposited using LPCVD, to a thickness between about 1000 to 5000 Angstroms.

10. The method of claim 1, wherein said third dopant is arsenic, ion implanted at an energy between about 30 to 80 Kev., at a dose between about 1E14 to 1E16 atoms/cm2.

11. A method of fabricating an erasable electrical programmable read only, (EEPROM), cell on a semiconductor substrate comprising the steps of:

forming a field oxide pattern on regions of said substrate, while leaving unoxidized silicon on remaining regions of said substrate;

thermally growing a gate oxide on said substrate;

depositing a silicon nitride layer on said gate oxide, and on said field oxide region;

patterning to form an island of said silicon nitride on said gate oxide;

ion implanting a first dopant into portions of said substrate, not masked by said silicon nitride island or said field oxide, to create source and drain regions;

depositing a first silicon oxide layer, on said field oxide region, on an upper surface of said silicon nitride island, on sidewalls of said silicon nitride island, and on regions of said gate oxide overlying said source and drain regions;

application of photoresist on said first silicon oxide layer;

etchback of said photoresist to expose said first silicon oxide layer on said upper surface of said silicon nitride island;

removal of said first oxide layer, from said exposed upper surface of said silicon nitride island, and from sidewalls of said silicon nitride island;

removal of said gate oxide from regions between said silicon nitride island and said photoresist to create a tunnel region;

removal of said photoresist;

removal of said silicon nitride island;

growing a first dielectric layer on said tunnel region to produce a tunnel insulator;

depositing a first polysilicon layer on said field oxide region on said gate oxide, and on said tunnel insulator;

ion implanting a second dopant into said first polysilicon layer;

patterning said first polysilicon layer to form polysilicon floating gate;

forming a second dielectric layer to create an interlevel dielectric, on said floating polysilicon gate structure;

depositing a second polysilicon layer over said field oxide region, on said interlevel dielectric overlying said floating polysilicon gate structure, ion implanting a third dopant into said second polysilicon layer; and patterning said second polysilicon layer to create a polysilicon control gate on said interlevel dielectric overlying said polysilicon floating gate and over said field oxide regions.

12. The method of claim 11, wherein said gate oxide is grown at a temperature between about 800° to 1000° C., to a thickness between about 150 to 300 Angstroms.

13. The method of claim 11, wherein said first dopant, used to create said source and drain regions, is arsenic, ion implanted at an energy between about 50 to 100 kev., at a dose between about 1E14 to 1E16 atoms/cm2.

14. The method of claim 11, wherein said first silicon oxide layer is grown using LPCVD, to a thickness between about 500 to 3000 Angstroms.

15. The method of claim 11, wherein said tunnel insulator is thermally grown silicon dioxide, grown in an oxygen ambient, at a temperature between about 800° to 1000° C., to a thickness between about 50 to 100 Angstroms.

16. The method of claim 11, wherein said first polysilicon layer, used to create said polysilicon floating gate, is deposited to a thickness between about 500 to 8000 Angstroms.

17. The method of claim 11, wherein said second dopant is arsenic, ion implanted at an energy between about 30 to 80 kev., at a dose between about 1E14 to 1E16 atoms/cm2.

18. The method of claim 11, wherein said interlevel dielectric is a composite of: an underlay of thermal oxide, grown in steam at a temperature between about 800° to 1000° C., to a thickness between about 50 to 100 Angstroms; an LPCVD silicon nitride layer, deposited to a thickness between about 50 to 100 Angstroms; and a silicon oxynitride surface layer, formed by subjecting silicon nitride to a wet oxygen treatment at a temperature between about 900° to 1050° C., for a time between about 20 to 40 minutes.

19. The method of claim 11, wherein said second polysilicon layer, used to create said polysilicon control gate, is deposited to a thickness between about 1000 to 5000 Angstroms.

20. The method of claim 11, wherein said third dopant is arsenic, ion implanted at an energy between about 30 to 80 Kev., at a dose between about 1E14 to 1E16 atoms/cm2.

* * * * *